United States Patent
Cheng et al.

(10) Patent No.: US 6,541,382 B1
(45) Date of Patent: Apr. 1, 2003

(54) LINING AND CORNER ROUNDING METHOD FOR SHALLOW TRENCH ISOLATION

(75) Inventors: Juing-Yi Cheng, Chishang town (TW); Syun-Ming Jang, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/550,262

(22) Filed: Apr. 17, 2000

(51) Int. Cl.[7] .............................................. H01L 21/302
(52) U.S. Cl. ........................ 438/692; 438/693; 438/706; 438/723; 438/724; 438/745; 438/757
(58) Field of Search .................................. 438/700, 706, 438/723, 724, 745, 757, 691–693

(56) References Cited

U.S. PATENT DOCUMENTS

| | | | |
|---|---|---|---|
| 5,455,194 A | * 10/1995 | Vasquez et al. | 437/67 |
| 5,578,518 A | 11/1996 | Koike et al. | 437/67 |
| 5,679,599 A | * 10/1997 | Mehta | 437/69 |
| 5,719,085 A | * 2/1998 | Moon et al. | 438/424 |
| 6,080,637 A | * 6/2000 | Huang et al. | 438/424 |

* cited by examiner

*Primary Examiner*—Benjamin L. Utech
*Assistant Examiner*—Charlotte A. Brown
(74) *Attorney, Agent, or Firm*—George O. Saile; Stephen B. Ackerman

(57) ABSTRACT

A method for forming shallow trench isolation on a silicon wafer is described wherein a trench is formed using a silicon nitride/pad oxide hardmask having a silicon oxynitride ARC layer over the nitride. After a trench is formed by dry etching, the hardmask is recessed by first selectively recessing the silicon nitride and then exposing the upper corners of the silicon trench by wet etching the pad oxide thereby exposed. A first sacrificial oxidation converts a portion of the silicon oxynitride ARC layer to oxide and rounds off the sharp upper silicon corners of the trench. The sacrificial oxide is removed and a trench lining oxide is grown to a prescribed thickness by a second oxidation which converts the remaining silicon oxynitride into silicon oxide while further rounding the upper silicon trench corners. By converting the entire oxynitride ARC layer to oxide, it becomes possible to planarized the filler oxide into the silicon nitride layer with a CMP process having a high oxide-to-nitride selectivity. This avoids dishing of large field areas which occurs when a low oxide-to-nitride selectivity planarization process must be used with residual oxynitride is present. The rounding of the silicon corners by the dual oxidation reduces oxide stress and thereby results in improved performance of devices formed adjacent to the trench isolation.

21 Claims, 7 Drawing Sheets

LINING AND CORNER ROUNDING METHOD FOR SHALLOW TRENCH ISOLATION

BACKGROUND OF THE INVENTION (1) Field of the Invention

The invention relates to processes for the manufacture of semiconductor devices and more particularly to processes related to the formation of STI (shallow trench isolation).

(2) Background of the Invention and Description of Previous Art

The formation of integrated circuit devices on silicon substrates requires that a means be provided to electrically isolate the various circuit components such as MOSFETs (metal oxide silicon field effect transistors) from each other. To this end regions of field insulation, typically of silicon oxide, are formed adjacent to the circuit components. In the discussion as well as in the description of the embodiments of the invention, the words "oxide", "nitride", and "oxynitride" are frequently used for the sake of brevity and are always intended to refer to "silicon oxide", "silicon nitride", and "silicon oxynitride" respectively.

The well known method of local oxidation of silicon (LOCOS) to form field oxide isolation around semiconductive devices built into the surface of silicon wafers has been practiced for over twenty-five years and has served well to provide field isolation for many applications. Over the years many problems with LOCOS have surfaced which have been addressed in a great variety of ways. Most notable are the problems which deal with the growth of oxide under the hardmask used to define the oxide regions and the resultant uneven surface topology over the field oxide. The oxide penetration under the mask is commonly referred to as birds-beak. These problems still persist and become aggravated as the technology tends towards smaller, shallower devices at high densities.

A promising replacement for LOCOS field oxide isolation has been found in trench isolation. Although deep trench isolation(DTI) has been used nearly as long as LOCOS for bipolar transistor isolation, it has not been widely practiced in the manufacture of CMOS (complimentary metal oxide silicon) integrated circuits. More recently, however, as device densities increase and isolation widths become smaller, shallow trench isolation(STI) is gaining favor over LOCOS in CMOS technology. The Trenches are formed in the silicon around the semiconductor devices by reactive ion etching. A silicon nitride/pad oxide hardmask, similar to that used for LOCOS oxidation, is used to define the trenches. After etching, the trenches are first lined, preferably with a thin (<200 Å) layer of thermal silicon oxide and then filled, either with silicon oxide with another material such as polysilicon. The filler material is deposited conformally on the wafer by a CVD (chemical vapor deposition) process. The wafer is then planarized by CMP (chemical mechanical planarization) which removes excess filler from the surface.

In the process described herein, a thin layer (less than about 500 Å of silicon oxynitride is deposited onto the silicon oxide layer as an ARC (anti-reflective coating) in order to eliminate reflections from the subjacent silicon during the photolithographic patterning of the nitrideoxide hardmask. The presence of this ARC during planarization necessitates the use of a low oxide-to-nitride selectivity CMP process in order to properly remove it. Failure to completely remove the silicon oxynitride ARC will result in patches of silicon nitride remaining after the nitride etch.

The low selectivity process, however, causes dishing over wide field regions. The dishing is ameliorated by removing filler material over non-field regions by wet etching through a reverse mask before CMP. If the oxynitride ARC could be easily removed before the filler material is deposited, a high oxide-to-nitride CMP process could be used. There would then be no dishing and consequently the need for the reverse mask and extra etching step would be eliminated. The present invention provides such a process.

Unlike LOCOS field isolation, the geometric features of STI are generally more abrupt, presenting sharp corners at both the top and bottom of the trenches. Sharp upper corners are particularly degrading and aggravate device performance issues which are stress related. In particular, major problems are encountered when STI is used in CMOS technology that are caused by electric field crowding at the edges of the active device regions. These problems include anomalous sub-threshold conduction and poor gate oxide integrity. In addition, tensile stresses are induced in the devices themselves by shrinkage of the trench filling oxide through densification of the oxide during subsequent annealing.

Koike, et.al., U.S. Pat. No. 5,578,518 shows a method for rounding the upper corners of silicon trenches whereby a thin 250 Å pad oxide under a polysilicon layer edge is recessed by undercutting with a wet etch prior to etching of the trench. The trench is then etched and a liner oxide is grown which rounds off the edge and simultaneously seals off the undercut. In a similar fashion, Moon, et.al., U.S. Pat. No. 5,719,085 recesses a 100 Å thick pad oxide under a silicon nitride layer edge. A first oxide is then grown which produces a birds beak under the nitride edges and rounds off the upper trench corners. The first oxide is removed and a second oxide is grown which extends the birds beak further under the nitride edge. Although the oxide stresses at the corners are diffused because of rounding, the nitride edge remains over the corners. Another application of an undercut pad oxide under an oxidation resistant layer edge is found in a recessed LOCOS isolation process cited by Vasquez, et.al., U.S. Pat. No. 5,455,194. Here undercutting of the pad oxide plays a role in suppressing lateral encroachment of oxide, also known as birds beak, in a poly buffered LOCOS process. A thin oxide, which does not fill the recess, is formed after the pad oxide is recessed. The recess is then filled with polysilicon which is subsequently oxidized.

SUMMARY OF THE INVENTION

It is an object of this invention to provide a method for improving the electrical characteristics of MOSFETs with channel regions defined and isolated by shallow trench isolation.

It is another object of this invention to provide a method for reducing upper corner stresses in shallow trench isolation regions.

It is yet another object of this invention to provide a method for forming a MOSFET isolated by STI with reduced mechanical stress, improved gate oxide integrity, and reduced electric field crowding at channel edges.

These objects are accomplished by plasma etching a silicon trench using a silicon nitridepad oxide hardmask with a silicon oxynitride ARC and then recessing the hardmask by wet chemical etching to expose the upper silicon corners of the silicon trench. A silicon oxide trench liner is then grown by a thermal oxidation process. Because the upper surfaces of the trench corners are exposed, the oxidation occurs both on top and on the sidewalls resulting in a rounding of the silicon corners. The silicon oxide trench liner is preferably formed by RTO (rapid thermal oxidation) using ISSG (in-situ steam generation).

It is yet another object of this invention to provide a method for forming a shallow trench lining oxide while simultaneously removing an anti-reflective coating.

It is yet another object of this invention to provide a method for forming a shallow trench lining oxide which permits the use of a high oxide selectivity process for planarizing shallow trench isolation.

It is still another process of this invention to provide a shallow trench lining process which eliminates the need for a reverse mask to prevent dishing of wide field regions during subsequent chemical mechanical planarization of shallow trench isolation.

These objects are accomplished by subjecting a freshly etched silicon trench by a first oxidation process whereby a major portion of a silicon oxynitride ARC is converted to silicon oxide while a sacrificial lining oxide is formed in the trench. The silicon oxynitride ARC is deposited onto the silicon nitride layer of the silicon nitride pad oxide hardmask and is used to eliminate light reflections during photolithographic patterning of the hardmask. The sacrificial oxide and the oxidized portion of the ARC is then removed by etching in aqueous HF. A final silicon oxide trench liner of a prescribed thickness is then formed by a second oxidation which also converts the remaining silicon oxynitride ARC to silicon oxide. The oxide lined trench is next filled with a filler material such as CVD silicon oxide. The wafer surface is then planarized into the silicon nitride layer by a high oxide-to-nitride selectivity CMP process, for example one which employs a polishing slurry containing $CeO_2$.

It is yet another object of this invention to describe a process which combines both corner rounding of upper trench corners and the removal of a silicon oxynitride ARC prior to trench filling thereby eliminating the need of a reverse mask and the accompanying etch step while at the same time reducing mechanical stress, improving gate oxide integrity, and reducing electric field crowding at channel edges.

These objects are accomplished by plasma etching a silicon trench using a silicon nitride pad oxide hardmask with a silicon oxynitride ARC and then recessing the hardmask by wet chemical etching to expose the upper silicon corners of the silicon trench. Next a sacrificial oxide is grown, in a first oxidation step, whereby a portion of the silicon oxynitride ARC is converted to silicon oxide. The sacrificial oxide and the oxide over the ARC is then removed by wet chemical etching and a silicon oxide trench liner is grown by a second thermal oxidation step while the remaining oxynitride is converted to silicon oxide. The sacrificial oxide growth not only converts most of the ARC to oxide but also further improves the rounding of the upper trench corners. The sacrificial oxide and the lining oxide are preferably formed by RTO (rapid thermal oxidation) using ISSG (in-situ steam generation). The oxide lined trench is filled with a filler material such as CVD silicon oxide. The wafer surface is then planarized into the silicon nitride layer by a high oxide-to-nitride selectivity CMP process, for example one which employs a polishing slurry containing $CeO_2$. An oxide-to-nitride selectivity of greater than about 10:1 is preferred.

DESCRIPTION OF THE PREFERRED EMBODIMENTS

Figure 1A:
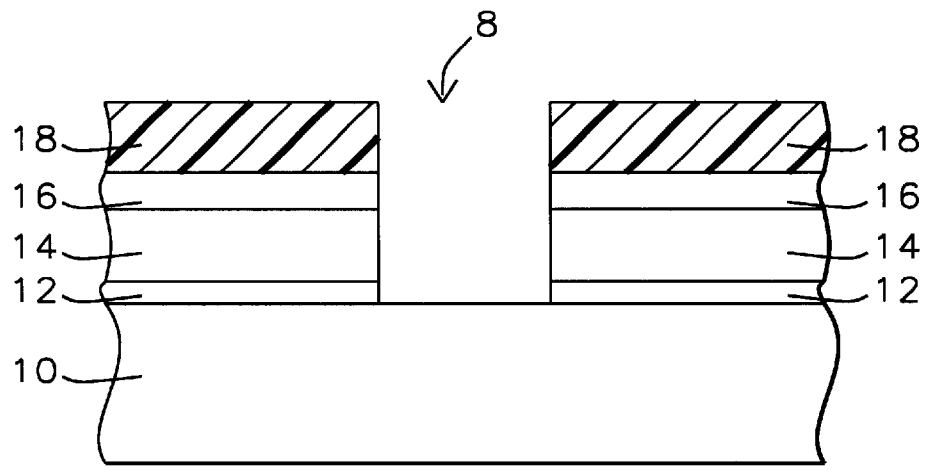
FIG. 1A through FIG. 1H are cross sections of a portion of a silicon wafer showing process steps used in the formation of shallow trench field isolation according to a first embodiment of this invention.

In a first embodiment of the current invention, a monocrystalline <100> oriented silicon wafer is provided. Referring to FIG. 1A, a pad oxide 12 is formed on the wafer 10 preferably by thermal oxidation. The pad oxide 12 is between about 50 and 200 Angstroms thick. A silicon nitride layer 14 is then deposited onto the pad oxide 12, preferably by LPCVD (low pressure chemical vapor deposition. The silicon nitride layer 14 is between about 500 and 2,000 Angstroms thick. An ARC (Anti-reflective coating) layer 16 of silicon oxynitride, between about 200 and 600 Angstroms thick, is next deposited onto the silicon nitride layer 14, preferably also by LPCVD. Alternately, the silicon nitride layer 14 and or the silicon oxynitride layer 16 may be deposited by another CVD method such as PECVD (plasma enhanced CVD) or by sputter deposition. These and other methods for depositing silicon nitride and silicon oxynitride layers are well known and widely practiced in the art.

A layer of photoresist 18 is deposited onto the silicon oxynitride layer 16 and photolithographically patterned to define a trench opening 8. The silicon oxynitride ARC layer 16 serves to reduce reflections of radiation during the patterning exposure of the photoresist layer 18 to the patterning radiation.

Using the photoresist pattern as a mask, the silicon oxynitride layer 16, the silicon nitride layer 14 and the subjacent pad oxide 12 are anisotropically etched, preferably by plasma etching to form a hardmask with an opening 8. The purpose of the pad oxide 12 is to provide a stress buffer beneath the silicon nitride layer 14 to prevent stress induced dislocations during subsequent thermal processing steps. Silicon nitride pad oxide hardmasks are well known in the art and are widely used to form LOCOS field isolation as well for etching trenches for STI. Etchant chemistries and parameters for plasma etching the layers of the hardmask are also well established in the art. By using a hardmask, the photoresist layer 18 may be made thin (between about 0.4 and 0.6 microns thick) in order to obtain the high pattern resolution afforded by DUV (deep ultraviolet) photolithography.

Figure 1B:
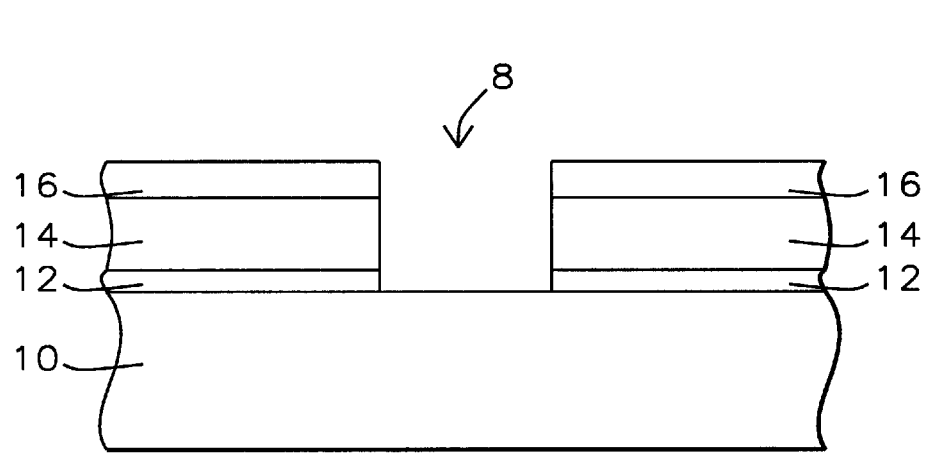

Referring next to FIG. 1B, the hardmask, which comprises the oxynitride layer 16, the silicon nitride layer 14, and the pad oxide 12, is then used to further etch the opening 8 into the exposed silicon to form a trench wherein field oxide isolation is to be formed.

After etching the hardmask, a silicon trench is etched into the wafer 10, preferably by an anisotropic dry etching method, for example by RIE (reactive ion etching). The sidewalls of the silicon trench opening 8 are essentially vertical. The silicon trench 8 is etched using an etchant gas containing a halogen. The techniques for etching silicon trenches by RIE are well known by those in the art. The trench in the opening 8 is etched to a depth of between about 0.3 and 0.6 microns. The width of the etched trench opening 8 is between about 0.1 and 1,000 microns.

Figure 1C:
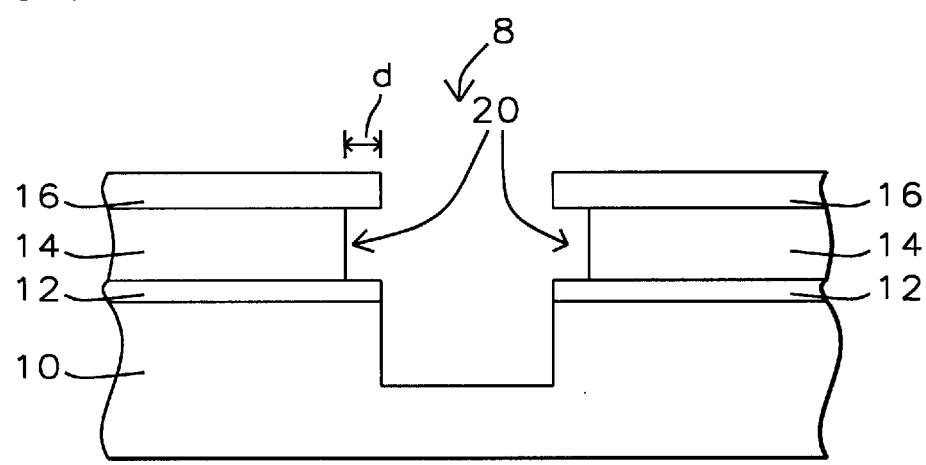
Figure 1D:
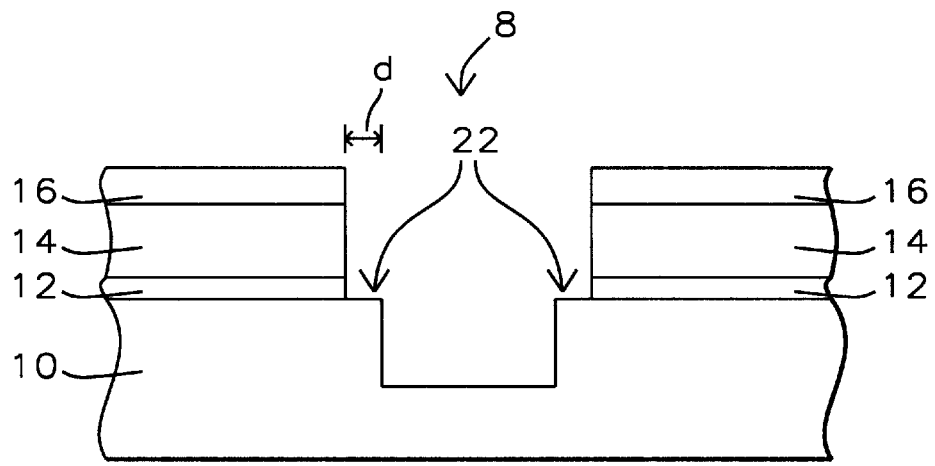

Turning attention next to FIG. 1C, the silicon nitride portion of the hardmask is recessed a distance "d" in the opening 8, by a dip in 85% Phosphoric acid at a temperature of between about 150 and 200° C. The phosphoric acid etchant must be calibrated in order to establish the etch rate. The recessed distance "d" is preferably between about 100 and 500 Angstroms. With the phosphoric acid at a temperature of about 160° C., the etch rate of the hot phosphoric acid is between about 40 and 100 Angstroms per second. After the recess 20 has been etched, the overhanging silicon oxynitride and underlying exposed pad oxide is removed by a dip in a rate calibrated dilute aqueous HF solution. Alternately a calibrated buffered HF etchant may be used. The completed recessed opening 8 is shown in FIG. 1D. Both sides of the sharp silicon corners 22 lie exposed.

Figure 1E:
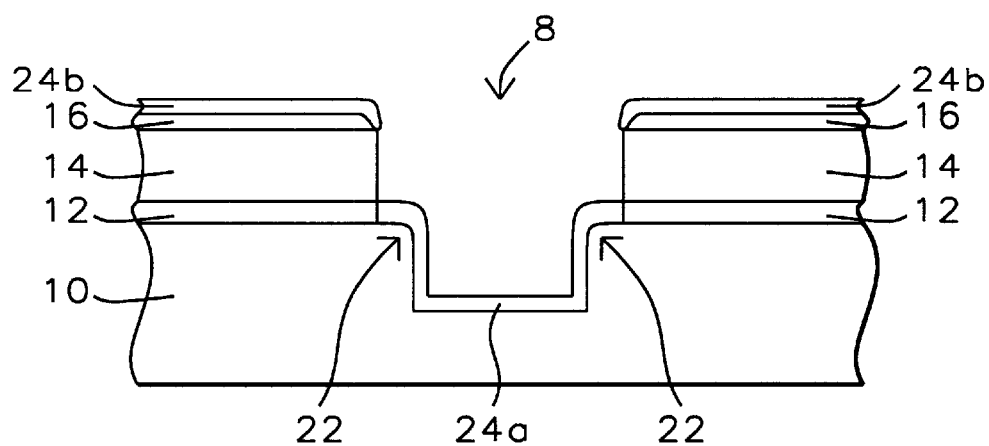

Referring now to FIG. 1E, a silicon oxide liner 24a is formed on the exposed silicon surfaces by rapid thermal oxidation (RTO) with in-situ generated steam (ISSG). The oxide liner is grown to a thickness of between about 50 and 500 Agstroms. ISSG oxides, formed by in-situ combination of $H_2$ and $O_2$ provide better corner rounding than other oxidation methods.

Because oxidation of the silicon occurs on both sides of the corners 22, the corners become rounded and the accompanying oxide stresses in their vicinity are diffused and reduced. As the oxide liner 24a is formed in the trench, the silicon oxynitride ARC is also partially oxidized to form a silicon oxide layer 24b on the ARC surface.

Figure 1F:
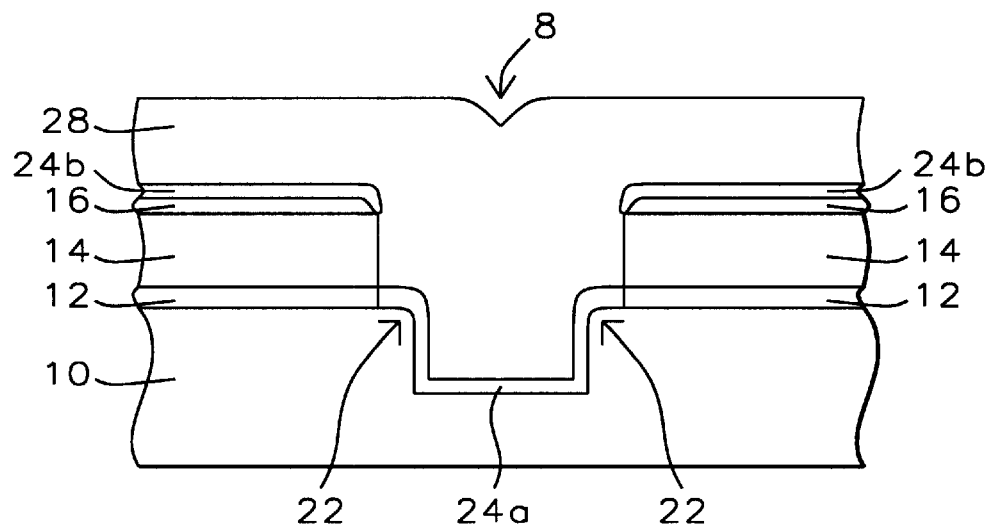

Referring to FIG. 1F, a layer of silicon oxide 28 is deposited, preferably by LPCVD, filling the trench opening 8. The trench filler oxide 28, is preferably deposited by the thermal decomposition of tetraethoxy orthosilicate(TEOS) which is conformal and may be accomplished at temperatures between 650 and 800° C. Deposition procedures for these various materials are well understood by those in the art.

After deposition, the filler oxide 28 is densified by subjecting the wafer 10 to an ambient of wet oxygen or steam at a temperature of 800° C. or thereabout for a period of about 30 minutes. The surface of the wafer 10 is then subjected to a planarization process, preferably CMP. The planarization process removes filler material over the planar regions of the wafer and is accomplished until the surface of the wafer is polished into the silicon nitride layer 14. The nitride layer 14 is then removed by etching with hot $H_3PO_4$. Alternately a plasma etch may be used to remove the residual nitride layer 14 using the pad oxide 12 as an etch stop. The pad oxide 12 is then removed by a dip in dilute aqueous HF.

Because residual silicon oxynitride ARC remains on the silicon nitride layer, CMP with a low oxide-to-nitride selectivity must be used to evenly polish the oxide and oxynitride layers into the silicon nitride layer. A suitable oxide-to-nitride selectivity is between about 1:2 and 1:3. A CMP polishing slurry containing $SiO_2$ is preferred. If the wafer 10 contains wide regions of STI field oxide, a reverse mask etching procedure must be used to prevent dishing in these regions. The reverse mask etching procedure selectively removes deposited filler oxide over the non-STI regions by anisotropic plasma etching. Reverse mask etching procedures for selectively removing material are well known in the art. Because the reverse mask etching procedure introduces additional process steps, it is preferable to employ the process of the first embodiment in instances where dishing is not a problem, that is for product without large wide field regions. Where such wide field regions are present it is preferable to employ the process of the third embodiment which not only incorporates corner rounding, but also converts the entire oxynitride ARC into silicon oxide, thereby permitting the use of high oxide-to-nitride selectivity CMP process, for example one which employs a polishing slurry containing $CeO_2$. An oxide-to-nitride selectivity of greater than about 10:1 is preferred.

Figure 1G:
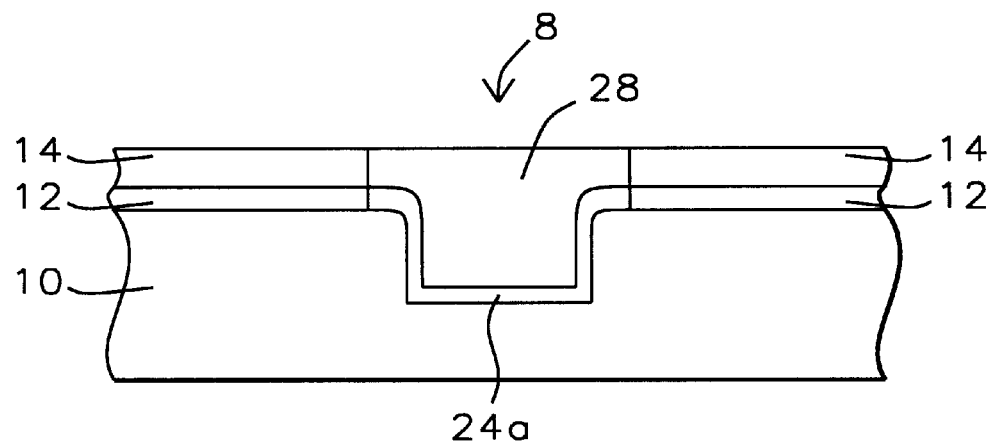

The planarized wafer surface is shown in FIG. 1G. Alternative methods of planarization such as reactive ion etch back may also be employed. CMP and other planarization methods are well known and widely practiced in the semiconductor industry. The filler oxide densification step may alternately be performed after the planarization step. Additionally a thin silicon nitride layer (not shown) may be deposited on the liner oxide 24a before depositing the filler oxide 28. The additional nitride layer seals the liner oxide from contamination and protects the silicon trench walls from further oxidation during densification of the trench filler material.

Figure 1H:
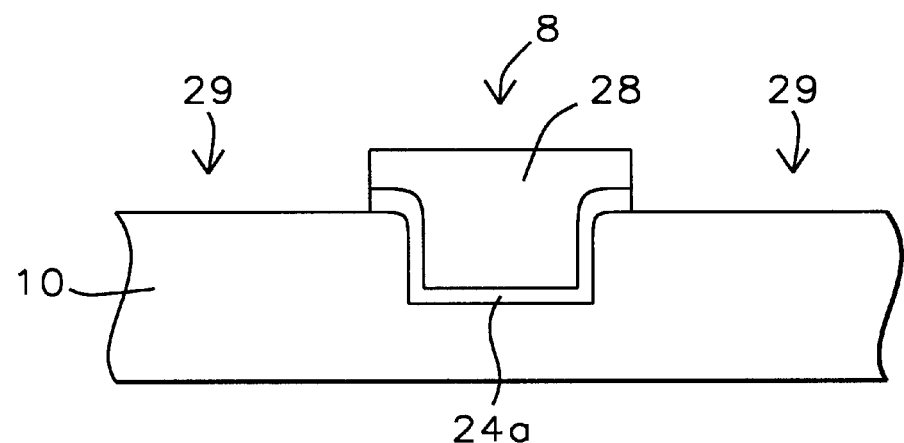

After planarization the exposed silicon nitride layer 14 is removed by etching in hot (160–180° C.) phosphoric acid etchant and the subjacent pad oxide by a dilute HF dip etch. The completed STI 8 is shown in FIG. 1H. Semiconductor devices, for example polysilicon gate MOSFETs are then built in the active silicon regions 29 adjacent to the STI by well known semiconductor manufacturing procedures.

In a second embodiment of this invention the silicon nitride layer is recessed as in the first embodiment. Next a sacrificial oxide is grown on the exposed silicon trench. The sacrificial oxide converts a large portion of the oxynitride ARC to silicon oxide and also causes some corner rounding of the trench upper corners. The sacrificial oxide is removed and the final liner oxide is grown to a prescribed thickness. During the final liner oxide growth, the trench corner acquires additional rounding and the remaining silicon oxynitride ARC is converted to silicon oxide. Thus, by the addition of only two simple process steps, corner stresses and the accompanying device degradation cause by them are further reduced and at the same time the removal of residual oxynitride ARC before trench filling permits the use of a high oxide-to-nitride selectivity CMP process for product with wide regions of field isolation, without the need for a more complex reverse mask/etch procedure.

In forming the second embodiment the process for the process of the first embodiment is carried out to the point where the silicon nitride layer has been recessed within the opening 8 by etching in hot phosphoric acid. Turning attention back to FIG. 1D, the silicon nitride portion of the hardmask has been recessed a distance "d" in the opening 8, by a dip in 85% Phosphoric acid at a temperature of between about 150 and 200° C.?. The phosphoric acid etchant must be calibrated in order to establish the etch rate. The recessed distance "d" is preferably between about 100 and 500 Angstroms. With the phosphoric acid at about 160° C. the etch rate of the hot phosphoric acid is between about 40 and 100 Angstroms per second. As in the first embodiment, the overhanging silicon oxynitride and underlying exposed pad oxide is removed by a dip in a rate calibrated dilute aqueous HF solution after the recess 20 has been etched. Both sides of the sharp silicon corners 22 lie exposed.

Figure 2A:
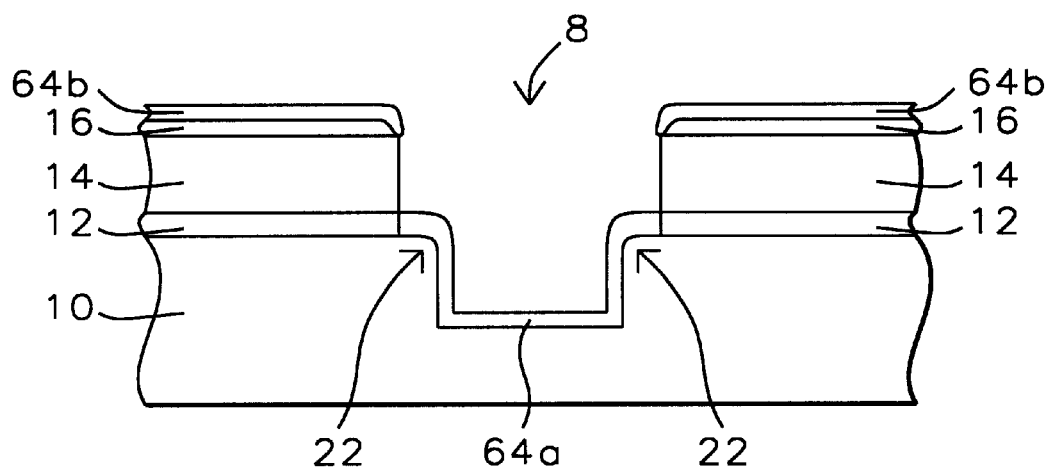
FIG. 2A through FIG. 2F are cross sections of a portion of a silicon wafer showing process steps used in the formation of shallow trench field isolation according to a second embodiment of this invention.

Referring now to FIG. 2A, a sacrificial silicon oxide layer 64a is grown on the exposed silicon surfaces by rapid thermal oxidation (RTO) with in-situ generated steam (ISSG). The sacrificial oxide layer 64a is grown to a thickness of between about 100 and 300 Angstroms. Alternately another clean thermal oxidation process may be used to form sacrificial oxide 64a such as furnace oxidation or dry RTO in oxygen.

Because oxidation occurs on both sides of the corners 22 the corners become rounded. As the oxide 64a grows in the trench, the silicon oxynitride ARC is also partially oxidized to form a silicon oxide layer 64b on the ARC surface. The thickness of the sacrificial oxide is chosen to be sufficient to convert most of the silicon oxynitride ARC 16 into silicon oxide so that, after the final trench liner oxide is subsequently grown, all of the remaining oxynitride ARC will have been converted into silicon oxide.

Figure 2B:
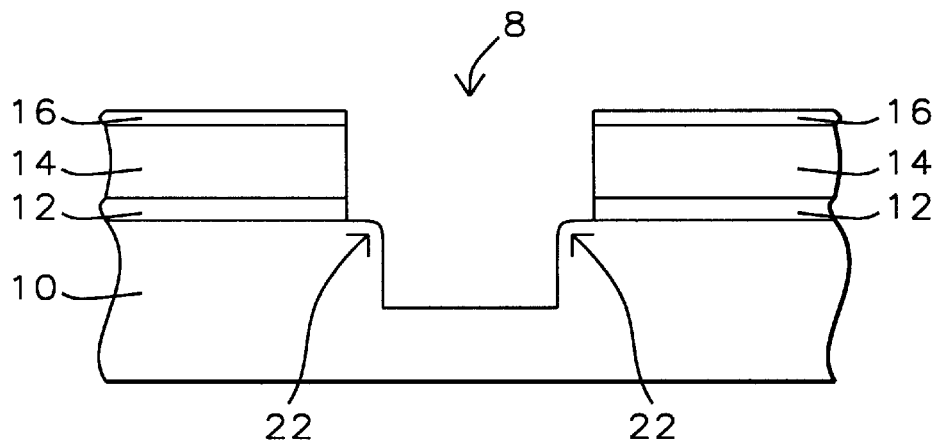

The wafer 10 is next dipped into dilute aqueous HF to remove the sacrificial oxide 64a and the portion 64b of the ARC which was converted to silicon oxide. In the present embodiment an etchant comprising a between about 50:1 and 100:1 dilution of commercial (49 wt. percent) HF with DI (de-ionized water) at room temperature is sufficient to remove the sacrificial oxide in a few seconds. Alternately a comparably diluted buffered HF etchant may be used. The cross section of the trench 8 after the removal of the sacrificial oxide is shown in FIG. 2B.

Figure 2C:
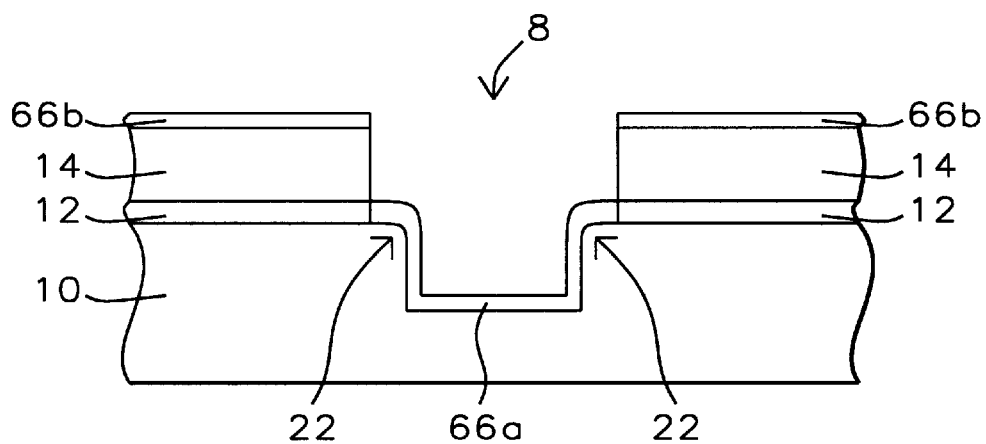

Referring now to FIG. 2C, a silicon oxide trench liner 66a is formed on the exposed silicon surfaces by RTO with ISSG. The oxide liner is grown to a thickness of between about 100 and 300 Angstroms. Alternately another clean thermal oxidation process may be used to form the liner oxide 66a such as furnace oxidation or dry RTO in oxygen. In the process of the oxidation, the corners 22 are further rounded and the accompanying oxide stresses in their vicinity are diffused and reduced. As the oxide liner 66a is formed in the trench, the residual silicon oxynitride ARC 16 is completely converted a silicon oxide layer 66b.

Figure 2D:
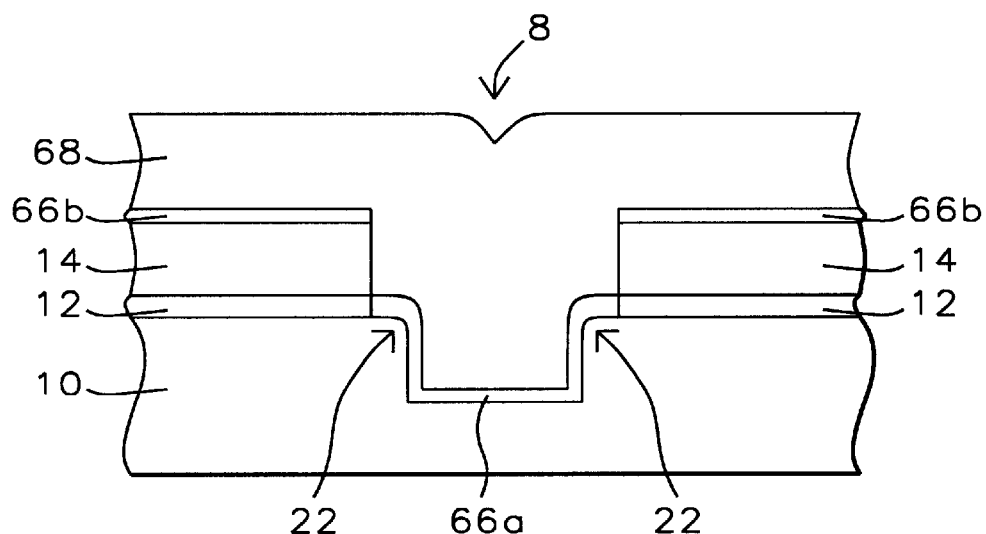

Referring to FIG. 2D, a layer of silicon oxide 68 is deposited, preferably by LPCVD, filling the trench opening 8. The trench filler oxide 68, is preferably deposited by the thermal decomposition of tetraethoxy orthosilicate(TEOS) which is conformal and may be accomplished at temperatures between 650 and 800° C. Deposition procedures for these various materials are well understood by those in the art.

Figure 2E:
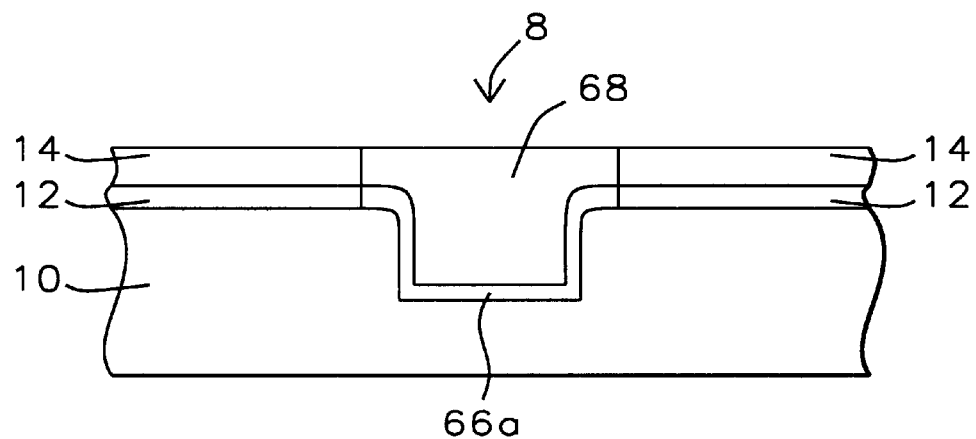
Figure 2F:
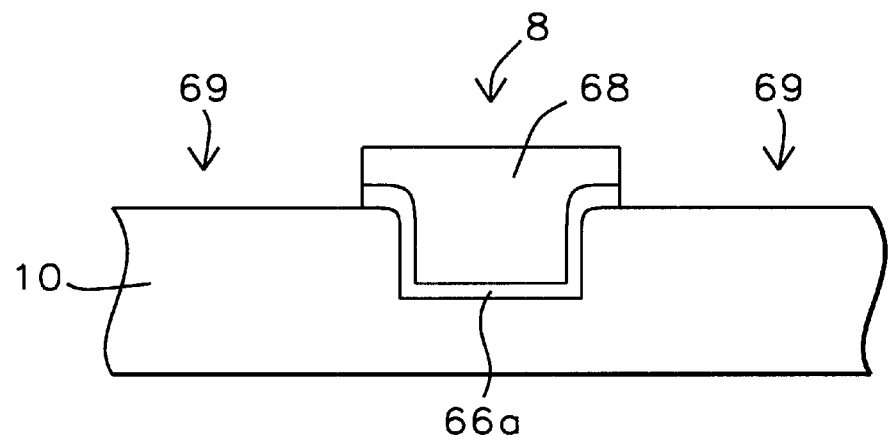

After deposition, the filler oxide 68 is densified by subjecting the wafer 10 to an ambient of wet oxygen or steam at a temperature of 800° C. or thereabout for a period of about 30 minutes. The surface of the wafer 10 is then planarized, preferably by CMP using a $CeO_2$ slurry at an oxide-to-nitride selectivity greater than about 10:1. The planarization process removes filler material over the planar regions of the wafer and is accomplished until the surface of the wafer is polished into the silicon nitride layer 14 as is illustrated in FIG. 2E. The nitride layer 14 is then removed by etching with hot $H_3PO_4$. Alternately a plasma etch may be used to remove the residual nitride layer 14 using the pad oxide 12 as an etch stop. The pad oxide 12 is then removed by a dip in dilute aqueous HF. The completed trench isolation is shown in FIG. 2F. Semiconductor devices, for example polysilicon gate MOSFETs are then constructed in the active silicon regions 69 adjacent to the STI 8 by conventional semiconductor manufacturing procedures.

A third embodiment of the invention is similar to the second embodiment but omits the recession of the silicon nitride layer. In this instance the full benefits of corner rounding, afforded by the two-sided corner exposure of the first and second embodiments are not be realized. However, the use of the sacrificial oxide not only simplifies the planarization process because of the complete conversion of the silicon oxynitride ARC 16, but also the dual oxidation (sacrificial and liner) provides more upper corner stress relief than the liner oxidation alone. This is because some amount of corner rounding can occur by virtue of oxidation under the edge of the pad oxide 12. Thereby, in instances where process cycle time is to be minimized and product design permits, the two wet etching steps (Hot $H_3PO_4$ and HF dip) which accomplish the hardmask recession can be eliminated.

Figure 3A:
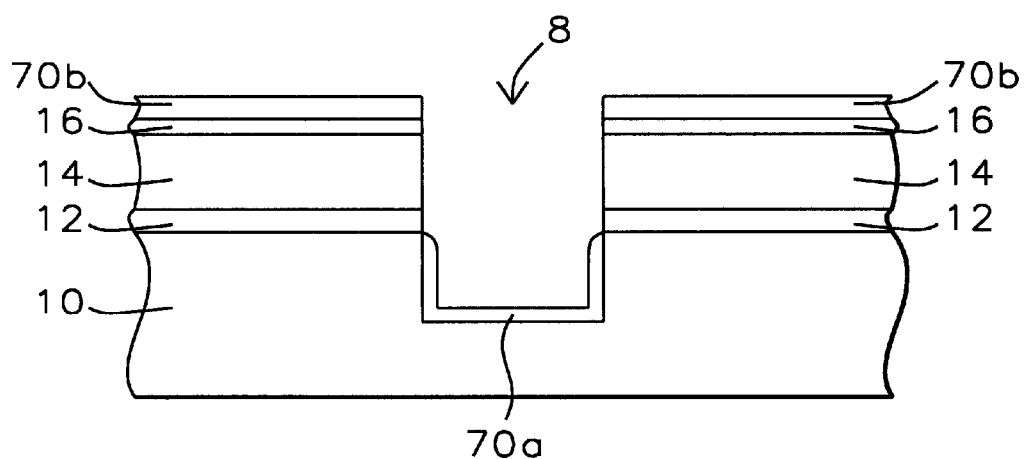
FIG. 3A through FIG. 3F are cross sections of a portion of a silicon wafer showing process steps used in the formation of shallow trench field isolation according to a third embodiment of this invention.

In exercising the third embodiment of this invention, the process for the first embodiment is carried out to the point where the silicon trench has been etched in the opening 8 as is shown in FIG. 1B. Referring now to FIG. 3A, a sacrificial silicon oxide layer 70a is grown on the exposed silicon surfaces by rapid thermal oxidation (RTO) with in-situ generated steam (ISSG). The sacrificial oxide layer 70a is grown to a thickness of between about 100 and 300 Angstroms. Alternately another clean thermal oxidation process may be used to form sacrificial oxide 74a such as furnace oxidation or dry RTO in oxygen. As the oxide 70a grows in the trench, the silicon oxynitride ARC 16 is also partially oxidized to form a silicon oxide layer 70b on the ARC surface. The sacrificial oxide thickness is chosen to be sufficient to convert most of the silicon oxynitride ARC 16 into silicon oxide so that, after the final trench liner oxide is subsequently grown, all of the remaining oxynitride ARC will have been converted into silicon oxide.

Figure 3B:
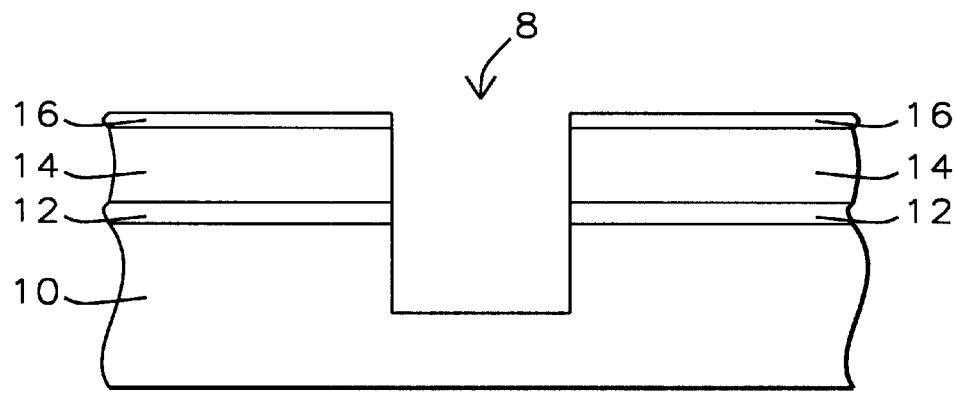

The wafer 10 is next dipped into dilute aqueous HF to remove the sacrificial oxide 70a and the portion 70b of the ARC which was converted to silicon oxide. In the present embodiment a brief dip in an etchant comprising a between about 50:1 and 100:1 dilution of commercial (49 wt. percent) HF with Dl (de-ionized water) at room temperature is sufficient to remove the sacrificial oxide. Alternately a comparably diluted buffered HF etchant may be used. The cross section of the trench 8 after the removal of the sacrificial oxide is shown in FIG. 3B.

Figure 3C:
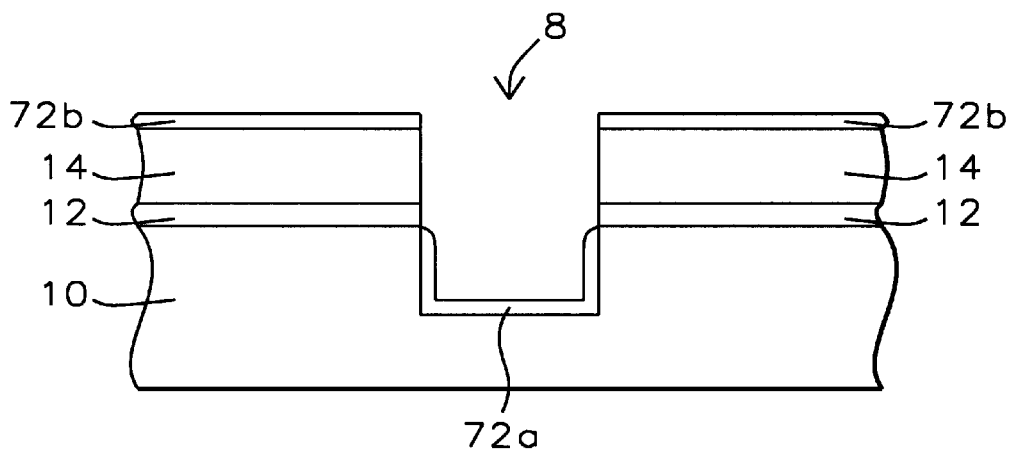

Referring now to FIG. 3C, a silicon oxide trench liner 72a is formed on the exposed silicon surfaces by RTO with ISSG. The oxide liner is grown to a thickness of between about 100 and 300 Angstroms. Alternately another clean thermal oxidation process may be used to form the liner oxide 72a such as furnace oxidation or dry RTO in oxygen. As the oxide liner 72a is formed in the trench, the residual silicon oxynitride ARC 16 is completely converted to a silicon oxide layer 72b.

Figure 3D:
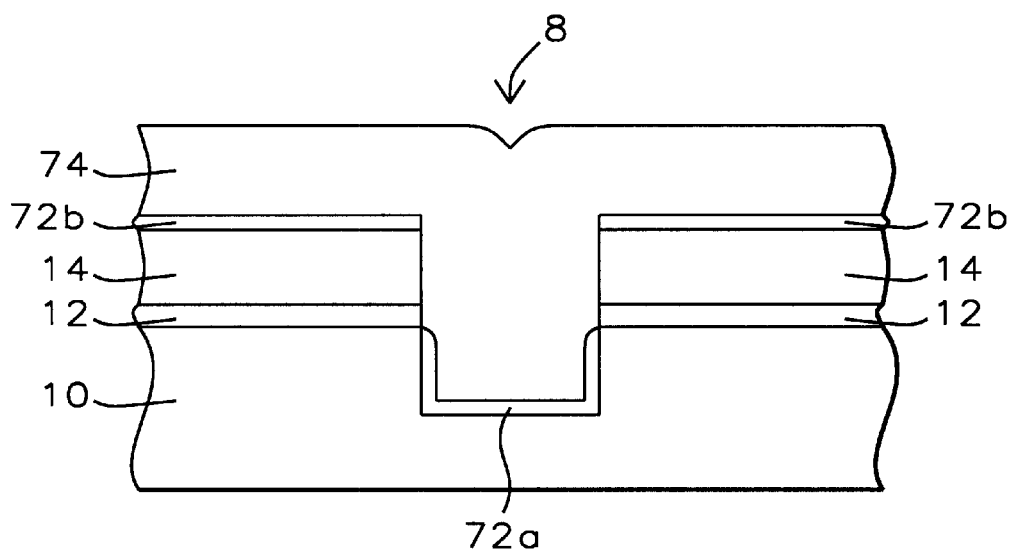

Referring to FIG. 3D, a layer of silicon oxide 74 is deposited, preferably by LPCVD, filling the trench opening 8. The trench filler oxide 74, is preferably deposited by the thermal decomposition of tetraethoxy orthosilicate(TEOS) which is conformal and may be accomplished at temperatures between 650 and 800° C. Deposition procedures for these various materials are well understood by those in the art.

Figure 3E:
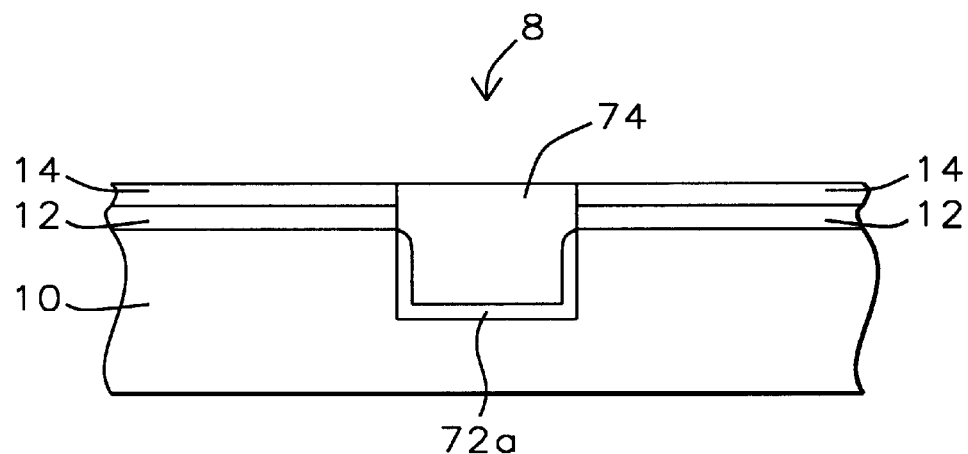
Figure 3F:
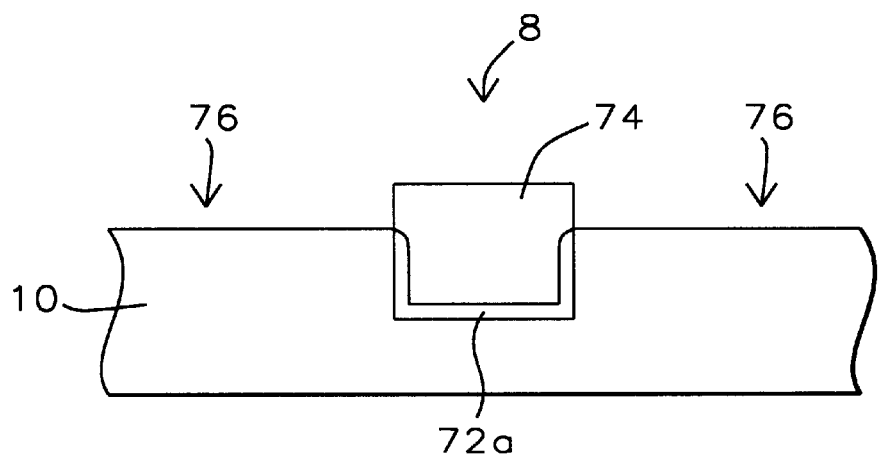

After deposition, the filler oxide 74 is densified by subjecting the wafer 10 to an ambient of wet oxygen or steam at a temperature of 800° C. or thereabout for a period of about 30 minutes. The surface of the wafer 10 is then subjected to a planarization process, preferably CMP using a $CeO_2$ slurry at an oxide-to-nitride selectivity greater than about 10:1. The planarization process removes filler material over the planar regions of the wafer and is accomplished until the surface of the wafer is polished into the silicon nitride layer 14 as is illustrated in FIG. 3E. The nitride layer 14 is then removed by etching with hot $H_3PO_4$. Alternately a plasma etch may be used to remove the residual nitride layer 14 using the pad oxide 12 as an etch stop. The pad oxide 12 is then removed by a dip in dilute aqueous HF. The completed trench isolation is shown in FIG. 3F. Semiconductor devices, for example polysilicon gate MOSFETs are then constructed in the active silicon regions 76 adjacent to the STI 8 by conventional semiconductor manufacturing procedures.

While this invention has been particularly shown and described with reference to the preferred embodiments thereof, it will be understood by those skilled in the art that various changes in form and details may be made without departing from the spirit and scope of the invention.

What is claimed is:

1. A method for forming shallow trench isolation comprising:
   (a) providing a silicon wafer having a pad oxide, a silicon nitride layer on said pad oxide, and a silicon oxynitride ARC layer on said silicon nitride layer;
   (b) patterning a photoresist layer over said ARC layer to define a trench;
   (c) anisotropically etching said ARC layer, said silicon nitride layer, and said pad oxide to form a hardmask with an opening;
   (d) anisotropically etching said silicon wafer, thereby forming a trench;
   (e) isotropically etching said silicon nitride layer, thereby forming a lateral recess in said silicon nitride layer extending a lateral distance from the upper edge of said trench and exposing a planar section of said pad oxide;
   (f) etching said planar section to expose upper silicon corners of said trench;
   (g) performing a first oxidation, thereby forming a first oxide in said trench and over said corners, causing a first rounding of said corners, while simultaneously converting a first portion of said ARC layer into $SiO_2$;
   (h) removing said first oxide and said first portion of said ARC layer;
   (i) performing a second oxidation, thereby forming a second oxide in said trench and over said corners, further rounding said corners and converting the remaining portion of said ARC layer into silicon oxide;
   (j) filling said trench by depositing a silicon oxide layer;
   (k) planarizing said silicon oxide layer into said silicon nitride layer by a chemical mechanical planarization process with an oxide-to-nitride selectivity of greater than about 10:1; and
   (l) removing residual said silicon nitride layer.

2. The method of claim 1 wherein said pad oxide is between about 50 and 200 Angstroms thick.

3. The method of claim 1 wherein said silicon nitride layer is between about 500 and 2,000 Angstroms thick.

4. The method of claim 1 wherein said silicon oxynitride ARC layer is between about 200 and 600 Angstroms thick.

5. The method of claim 1 wherein said lateral distance is between about 100 and 500 Angstroms.

6. The method of claim 1 wherein said anisotropic etching is selected from the group consisting of reactive ion etching and plasma etching.

7. The method of claim 1 wherein said first and said second oxidations are performed by rapid thermal oxidation with in-situ steam generation.

8. The method of claim 7 wherein said planarizing is accomplished with a polishing slurry containing $CeO_2$.

9. A method for forming shallow trench isolation comprising:
   (a) providing a silicon wafer having a pad oxide, a silicon nitride layer on said pad oxide, and a silicon oxynitride ARC layer on said silicon nitride layer;
   (b) patterning a photoresist layer over said ARC layer to define a trench;
   (c) anisotropically etching said ARC layer, said silicon nitride layer, and said pad oxide to form a hardmask with an opening;
   (d) anisotropically etching said silicon wafer, thereby forming a trench;
   (e) performing a first oxidation, thereby forming a first oxide in said trench while simultaneously converting a first portion of said ARC layer into $SiO_2$;
   (f) removing said first oxide and said first portion of said ARC layer;
   (g) performing a second oxidation, thereby forming a second oxide in said trench while simultaneously converting the remaining portion of said ARC layer into silicon oxide;
   (h) filling said trench by depositing a silicon oxide layer;
   (i) planarizing said silicon oxide layer into said silicon nitride layer by a chemical mechanical planarization process with an oxide-to-nitride selectivity of greater than about 10:1; and
   (j) removing residual said silicon nitride layer.

10. The method of claim 9 wherein said pad oxide is between about 50 and 200 Angstroms thick.

11. The method of claim 9 wherein said silicon nitride layer is between about 500 and 2,000 Angstroms thick.

12. The method of claim 9 wherein said silicon oxynitride ARC layer is between about 200 and 600 Angstroms thick.

13. The method of claim 9 wherein said anisotropic etching is selected from the group consisting of reactive ion etching and plasma etching.

14. The method of claim 9 wherein said first and said second oxidations are performed by rapid thermal oxidation with in-situ steam generation.

15. The method of claim 9 wherein said planarizing is accomplished with a polishing slurry containing $CeO_2$.

16. A method for forming shallow trench isolation comprising:
   (a) providing a silicon wafer having a pad oxide, a silicon nitride layer on said pad oxide, and a silicon oxynitride ARC layer on said silicon nitride layer;
   (b) patterning a photoresist layer over said ARC layer to define a trench;
   (c) anisotropically etching said ARC layer, said silicon nitride layer, and said pad oxide to form a hardmask with an opening;
   (d) anisotropically etching said silicon wafer, thereby forming a trench;
   (e) isotropically etching said silicon nitride layer, thereby forming a lateral recess in said silicon nitride layer extending a lateral distance from the upper edge of said trench and exposing a planar section of said pad oxide;
   (f) etching said planar section to expose upper silicon corners of said trench;
   (g) performing an oxidation, thereby forming an oxide in said trench and over said corners, causing a rounding of said corners, while simultaneously converting a portion of said ARC layer into silicon oxide;
   (h) filling said trench by depositing a silicon oxide layer;
   (i) planarizing said silicon oxide layer into said silicon nitride layer by a chemical mechanical planarization process with a polishing slurry containing $SiO_2$ and with an oxide-to-nitride selectivity of between about 1:2 and 1:3; and
   (j) removing residual said silicon nitride layer.

17. The method of claim 16 wherein said pad oxide is between about 50 and 200 Angstroms thick.

18. The method of claim 16 wherein said silicon nitride layer is between about 500 and 2,000 Angstroms thick.

19. The method of claim 16 wherein said silicon oxynitride ARC layer is between about 200 and 600 Angstroms thick.

20. The method of claim 16 wherein said lateral distance is between about 100 and 500 Angstroms.

21. The method of claim 16 wherein said anisotropic etching is selected from the group consisting of reactive ion etching and plasma etching.

* * * * *